United States Patent
Blessing et al.

(10) Patent No.: US 6,329,823 B2
(45) Date of Patent: Dec. 11, 2001

(54) PROCESS FOR MONITORING THE RESIDUAL CHARGE AND CAPACITY OF A BATTERY

(75) Inventors: Alf Blessing, Heiningen; Hans-Peter Schöner, Modautal, both of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/736,376

(22) Filed: Dec. 15, 2000

(30) Foreign Application Priority Data

Dec. 16, 1999 (DE) .............................................. 199 60 761

(51) Int. Cl.[7] .................................................. G01N 27/416
(52) U.S. Cl. ............................ 324/427; 320/136; 702/63
(58) Field of Search ................................... 324/426, 427; 320/136; 712/63

(56) References Cited

U.S. PATENT DOCUMENTS 5,596,260 * 1/1997 Moravec et al. ..................... 320/135

FOREIGN PATENT DOCUMENTS 29 52 853 A1    5/1981   (DE).

* cited by examiner

Primary Examiner—Gregory J. Toatley, Jr.
(74) Attorney, Agent, or Firm—Venable; Norman N. Kunitz

(57) ABSTRACT

Process for monitoring the residual charge and the capacity of a battery, where at least two voltage-current measurements have been carried out on the load-carrying battery. The current load of the battery selected here should be greater than 30% of the nominal capacity per hour, e.g. for a 100 Ah battery, at least 30 amperes. The initial voltage-current measurement is taken at an initial time for an initial load condition of the battery. A second voltage-current measurement is carried out at a second time for a second load condition of the battery. It is essential here that the load condition of the battery has changed because of the current that has been drawn. The current-voltage measurements produce an initial measuring point and a second measuring point. The two measuring points set an interpolation line and determine the point of intersection with a limiting voltage level ($U_{Gr}$). This point of intersection is marked by a so-called limiting current ($I_{Gr}$). The limiting voltage level is decided from the minimum voltage required by the connected consumers in order for them to operate fault-free. The limiting voltage level is therefore stipulated for the technical layout of the battery system and is known. Furthermore, fault-free operation of the connected consumers requires a minimum operating current ($I_{min}$), which is also specified and known as a design parameter of the battery system. The difference between the determined limiting current $I_{Gr}$ and the minimum operating current $I_{min}$ is determined and recorded. This difference is a dimension for the residual charge of the battery that is still available and in accordance with the invention is here designated as the limiting current reserve.

14 Claims, 1 Drawing Sheet

PROCESS FOR MONITORING THE RESIDUAL CHARGE AND CAPACITY OF A BATTERY

CROSS REFERENCE TO RELATED APPLICATION

This Application claims the priority of German Application No. 199 60 761.3, filed Dec. 16, 1999, which is incorporated herein by reference.

BACKGROUND OF THE INVENTION

The invention concerns a process in accordance with a process for monitoring the residual charge and the capacity of a load-carrying battery system with a limiting voltage level and a minimum current.

Battery monitoring systems that determine the state of charge of the battery in the current-free condition of the battery are well-known. Systems of this type utilise the largely linear dependency of the open-circuit voltage on the acid density of the electrolyte. This acid density changes in proportion to the amount of charge that has already been drawn from the battery. These systems can determine the charging condition of the battery when the battery has been current-free for a number of hours and the internal diffusion processes have calmed down.

Furthermore, it is known from the dissertation on a process to estimate the internal values of starter batteries by Steffens,W. ("Verfahren zur Schätzung der Inneren GröBcn von Starterbatterien"), RWTIH Aachen 1987, how to estimate the values of battery condition from examining a model. These values of battery condition also cover the open-circuit voltage of the battery. Although this model operates in the current carrying condition of the battery, no information is available on the remaining energy content of the battery. Also, the formation of the model is extremely complex and in practice, therefore, it has not won recognition.

SUMMARY OF THE INVENTION

It is therefore the object of the invention to provide a process to monitor a battery, that firstly allows the battery to be monitored without enforcing rest periods and secondly and simultaneously allows the remaining energy content of the battery to be determined.

According to the invention, this task is solved by the characterising features of the independent claim. Additional advantageous embodiments are contained in the sub-claims.

According to the invention, this is achieved by carrying out at least two current-voltage measurements on the load-carrying battery. The current load of the battery selected here should be greater than 30% of the nominal capacity per hour, e.g. for a 100 Ah battery, at least 30 amperes. The initial current-voltage measurement will be measured at an initial time for an initial load condition of the battery. A second current-voltage measurement will be carried out at a second time for a second load condition of the battery. It is essential here that the load condition of the battery has changed because of the current that has been drawn. The current-voltage measurements produce an initial measuring point and a second measuring point. The two measuring points set an interpolation line and determine the point of intersection with a limiting voltage level ($U_{Gr}$). This point of intersection is marked by a so-called limiting current ($I_{Gr}$). The limiting voltage level is decided from the minimum voltage required by the connected consumers in order for them to operate fault-free. The limiting voltage level is therefore stipulated for the technical layout of the battery system and is known. Furthermore, fault-free operation of the connected consumers requires a minimum operating current ($I_{min}$), which is also specified and known as a design parameter of the battery system. The difference between the determined limiting current $I_{Gr}$ and the minimum operating current $I_{min}$ is determined and recorded. This difference is a dimension for the residual charge of the battery that is still available and in accordance with the invention, is here designated as the limiting current reserve.

Primarily, the invention achieves the following advantages:

The limiting current reserve can be determined from a battery that is carrying current. This means that battery monitoring can also be carried out on systems that are operated continuously and thus do not allow open-circuit measurement of battery voltage. A typical example of this type of system in a vehicle is a taxi that is in use 24 hours a day. With a taxi of this type, conventional battery monitoring systems cannot function. The taxi driver does not receive any information on the imminent collapse of his vehicle electrical system and thus the failure of a number of relevant safety devices, such as anti-lock systems, airbags, electronic stabilisation programs, seatbelt pretensioning systems, level control systems, etc. The conventional charging current indicator lamp only gives information about the direction of current between the generator and the battery. However, with the charging current indicator lamp, it is not possible to make a diagnosis of the battery condition to anticipate the imminent collapse of the vehicle electrical system or whether there is still sufficient energy available for the systems relevant to safety. This will only become possible with the process according to the invention.

The limiting current reserve takes into consideration in a single dimension the influences relevant for battery diagnosis, such as the battery temperature, the average discharge current of the battery and the battery ageing condition.

The limiting current reserve is not affected by the diffusion processes or by other non-linearities of the battery, which in the case of small discharge currents, have a drastic effect on the battery voltage situation, and thus make it possible to obtain reliable and quantifiable information about the residual charge of the battery.

Determining, the limiting current reserve by means of the limiting current ($I_{Gr}$) evaluates the battery capacity in the fringe range of operability of the connected consumer system. The limiting current reserve thus allows a safety estimation, that the connected consumer system will not fail even in critical load conditions. This is a great advantage, particularly with regard to the aforementioned devices in a vehicle that are relevant to safety, as their presumably perfect function can be reliably forecast with the limiting current reserve.

Furthermore, the process according to the invention allows a maximum output to be specified that can still be drawn from the battery without falling below the limiting voltage level, by adding the limiting voltage level ($U_{Gr}$) and the limiting current ($I_{Gr}$).

BRIEF DESCRIPTION OF THE DRAWING

Below, typical embodiments of the invention are described and explained in more detail by reference to a drawing.

DETAILED DESCRIPTION OF THE PREFERRED EMBODIMENTS

Figure 1:
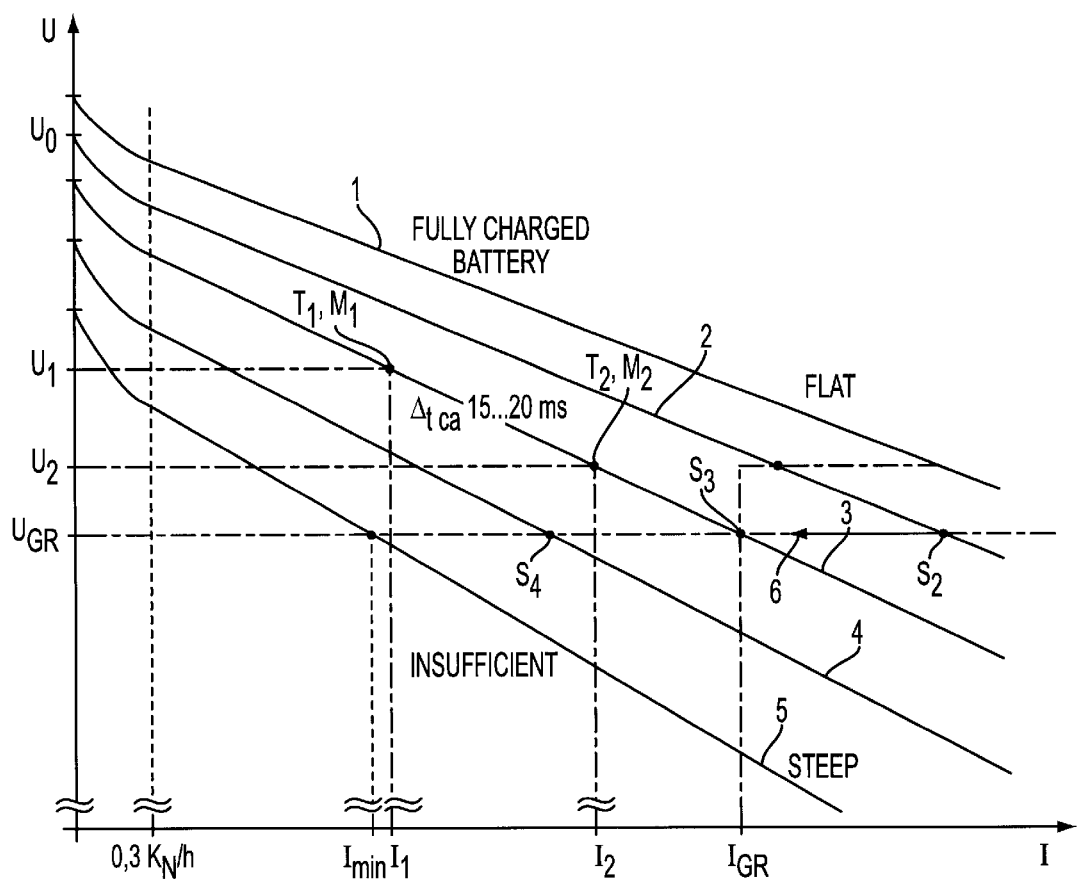
FIG. 1 shows a diagram of the correlation between the limiting voltage level ($U_{Gr}$), the limiting current ($I_{Gr}$) and the current-voltage characteristics of the battery, during different battery charging conditions.

FIG. 1 is used to explain the invention and in particular the limiting current reserve, by means of examples. FIG. 1 shows a typical group of current-voltage characteristics for a battery with different charging conditions. The number 1 identifies the characteristic curve for a fully charged battery. Characteristic curve 1 of a filly charged battery stands out because of its flat course. In other words, voltage U at the battery terminals decreases relatively little as load current I increases. As the battery becomes increasingly discharged or ages more, the course of current-voltage characteristics 2, 3, 4 and 5 gets ever steeper, until finally, current-voltage characteristic 5 intersects limiting voltage level $U_{Gr}$ at minimum current $I_{min}$. A battery in this condition is classified as dead. To determine the limiting current reserve of a battery with a charging condition that corresponds to characteristic curve 3, the procedure is as follows.

An initial current-voltage measurement is taken at an initial time $T_1$ for an initial load condition of the battery. A second voltage-current measurement is carried out at a second time $T_2$ for a second load condition of the battery. It is essential here that the load condition of the battery has changed because of the current that has been drawn. In addition to this, the load current of the battery must have been greater than 30% of the nominal capacity $K_N$ per hour. The current-voltage measurements produce an initial measuring point $M_1$ and a second measuring point $M_2$. The two measuring points $M_1$ and $M_2$ set an interpolation line 3 and determine the point of intersection $S_3$ with a limiting voltage level ($U_{Gr}$). This point of intersection is marked by a so-called limiting current $I_{Gr}$. The limiting voltage level is determined from the minimum voltage required by the connected consumers in order for them to operate fault-free. The limiting voltage level is therefore stipulated for the technical layout of the battery system and is known. Furthermore, fault-free operation of the connected consumers requires a minimum operating current $I_{min}$, which is also specified and known as a design parameter of the battery system. The difference between the determined limiting current $I_{Gr}$ and the minimum operating current $I_{min}$ is determined and recorded. This difference is a dimension for the residual charge of the battery that is still available and According to the invention is here designated as the limiting current reserve. In the same way, intersection points $S_2$ and $S_4$ can be determined from characteristic curves 2 and 4. It is obvious that as the battery becomes increasingly discharged, intersection points $S_2$, $S_3$ and $S_4$ move further to the left towards the minimum operating current $I_{min}$, shown symbolically by Arrow 6. The limiting current reserve determined in accordance with the invention therefore correctly describes the decreasing charging condition of the battery. In particular, the limiting voltage reaches the value 0, when the limiting current $I_{Gr}$ coincides with the minimum current $I_{min}$, as is the case with characteristic curve 5. Therefore the limiting voltage reserve for a battery that is dead in accordance with the definition yields the value 0.p Typically the two measuring points $M_1$ and $M_2$ are established at two times which are approximately 15 to 20 ms apart.

In a further typical embodiment in accordance with the invention, the limiting current reserve is determined by establishing each relevant current-voltage characteristic of the battery through a large number of voltage-current measurements at different load conditions. This large number of measuring points allows a mean straight line to be set, e.g. by the known regression method and the limiting current is again determined as the intersection point of this mean straight line with the limiting voltage level.

In a further embodiment, the limiting current reserve is determined from continuous observation of the current-voltage characteristic of the battery. This can be done by using known, so-called state observers, e.g. Lüenberg observers or Kalman filters. These state observers decide the slope and the intercept of an ordinate of the mean straight line for the current-voltage characteristic. The limiting current reserve is again decided as previously described, from the intersection point of this mean straight line with the limiting voltage level. A particularly advantageous feature of this embodiment is the fact that the limiting current and thus the limiting current reserve are always determined for the immediate battery condition, that is to say, in real time.

In all the embodiments, the residual charge $Q_{Rest}$ of the battery can be inferred from the limiting current reserve. In the simplest case, it is assumed that there is a linear correlation between the limiting current reserve and the residual charge of the batteries. Residual charge 0 is reached when the limiting current reserve has the value 0. The full charge of the battery corresponds to the limiting current reserve, which for a fully charged battery is determined under specified nominal conditions (e.g. with regard to the temperature). By deciding the relevant limiting current reserve in each case and comparing it with the two previously mentioned and decided boundary values, you obtain a dimension for the relevant charging condition of the battery. If a linear correlation between the limiting current reserve and the residual charge $Q_{Rest}$ is assumed, the quotient from the relevant limiting current reserve and the limiting current reserve for the fully-charged battery indicates the relevant charging condition of the battery in proportional parts of the full charge.

A more precise determination of the residual charge of the battery from the limiting current reserve results from the following relation:

$$Q_{Rest} \geq \frac{(I_{Gr} - I_{min})}{\left(\frac{dI_{Gr}}{dQ}\right)_{max}}$$

$$Q_{Rest} \geq \frac{\text{Limiting Current Reserve}}{\text{Maximum Limiting Current Slope}}$$

Here the maximum limiting current slope $$\left(\frac{dI_{Gr}}{dQ}\right)_{max}$$

is determined by experiment. The limiting current slope is a battery parameter. The limiting current slope is decided from a large number of load measurements, for which the limiting currents are decided in each case. From one load measurement to the next load measurement, the battery is discharged by a defined amount of charge in each case and the limiting current is determined for each charging condition. The limiting currents determined are plotted by the amounts of charge drawn and the measuring points obtained in this way are approximated by a curve. The maximum slope of the curve then yields the maximum limiting current slope described here.

According to the relations already cited, this produces a minimum estimation for the residual charge $Q_{Rest}$ still available in the battery. According to this, the residual charge of the battery is greater than or the same as the amount of charge given by the quotients from the limiting current reserve and the maximum limiting current slope.

At constant battery load, the residual discharging time still available can be inferred from the residual charge $Q_{Rest}$, by dividing the residual charge by the attendant load current. From the comparison of the residual discharging time with the minimum discharging time required for a specific function, it is possible to derive the advantage of knowing how long the battery in its present charging condition is in the position of being able to provide the requisite energy for the consumers actually connected. This is a particularly great advantage in vehicles, when the proper operation of the safety functions that have already been cited as examples has to be guaranteed.

With all these embodiments, the calculation accuracy of the limiting current is crucially important. This accuracy is greater, the larger the difference in the load current between the initial measurement to decide the limiting current reserve and the second measurement to decide the limiting current reserve. In other words, operating conditions during which there are major load changes for the battery and thus major current changes, are particularly advantageous for implementing the embodiments in accordance with the invention. Major load changes of this type occur with a vehicle during the starting operation, for example. It is therefore particularly advantageous to implement the embodiments in accordance with the invention when starting a vehicle.

Furthermore, in a vehicle electrical system, it is possible for there to be major load changes caused by temporarily switching powerful consumers on or off. Major load changes are caused, for example, by the starting or stopping operation of heat consumers ( rear screen heater, independent vehicle heating in the cooling circuit, heated seats, static heating, etc.). The limiting current reserve and the residual charge of the battery, the residual discharging time or the minimum charging time, are then decided as previously described.

A further way in which major load changes and thus different load conditions can be brought about deliberately in the vehicle electrical system by switching operations is by temporarily switching off the vehicle electrical system generator or by varying the generator excitation. Compared to switching consumers on and off, alteration of the generator voltage has the advantage that it is possible to dispense with switching on an additional function that might not be required or needed, to deliberately cause a load change in the vehicle electrical system. So, if the generator voltage is altered on hot days in summer, for example, there is no need to switch on any independent heating, just to bring about a load change. The limiting current reserve and the residual charge of the battery, the residual discharging time or the minimum charging time are then decided as previously described.

In individual cases, it can also be an advantage to deliberately cause a repeated load change in the vehicle electrical system. A repeated load change is particularly useful if the mean curve of the current-voltage characteristic of the battery is to be established from a large number of measuring points to decide the limiting current reserve. In this case, a current-voltage characteristic measuring point is established for each load condition. The number of possible measuring points here is dependent on the number of deliberately causable load conditions. In order to be able to establish as large a number of measuring points as possible, it is therefore an advantage to combine the two previously described options, that is to say, varying the generator voltage and switching consumers on and off, as this produces the largest number of possible load changes and load conditions that can be called upon to decide battery parameters, in accordance with the invention. The limiting current reserve and the residual charge of the battery, the residual discharging time or the minimum charging time are then decided as previously described.

What is claimed is:

1. A process for monitoring the residual charge and the capacity of a load-carrying battery in a battery system with a limiting voltage level ($U_{Gr}$) and a minimum current ($I_{min}$) where:

at least at an initial time ($T_1$), at least an initial voltage-current-measurement is carried out for an initial load condition of the battery and at least an initial measuring point ($M_1$) is determined, at least at a second different time ($T_2$), at least a second voltage-current measurement is carried out for a second load condition of the battery and at least a second measuring point ($M_2$) is determined, the measuring points ($M_1$ and $M_2$) are always determined at a load condition of the battery that is greater than 30% of the nominal capacity per hour ($K_N/h$), the measuring points ($M_1$ and $M_2$) set a mean curve (3), and the point of intersection ($S_3$) of the mean curve with the limiting voltage level ($U_{Gr}$) is determined and the associated limiting current ($I_{Gr}$) is determined, and the differences between the limiting current ($I_{Gr}$) and the minimum current ($I_{min}$) determines a limiting current reserve as the dimension for the residual charge available in the battery.

2. Process according to claim 1, wherein the mean curve is an interpolation line.

3. Process according to claim 1, wherein the mean curve is obtained by the measuring points ($M_1$ and $M_2$) from a large number of measuring points.

4. Process according to claim 3, wherein a mean straight line is set by the large number of measuring points.

5. Process according to claim 1, wherein the mean curve is decided by the continuous observation of the current-voltage characteristic and a mean straight line is decided by use of a state observer.

6. Process according to claim 5, wherein the state observer is a Lüenberg observer or a Kalman filter.

7. Process according to claim 1, including adding the limiting voltage level ($U_{Gr}$) and the limiting current ($I_{Gr}$) to determine a dimension for a maximum output that can still be drawn from the battery without falling below the limiting voltage level ($U_{Gr}$).

8. Process according to claim 1, wherein a ratio is formed, as a dimension for the residual charge ($Q_{Rest}$) of the battery in relation to the nominal charge, from each relevant limiting current reserve and limiting current reserve for a fully-charged battery, at nominal conditions.

9. Process according to claim 1, wherein a ratio is formed, as a dimension for the residual charge ($Q_{Rest}$) of the battery, from the limiting current reserve and the maximum limiting current slope.

10. Process according to claim 8, wherein the residual charging time of the battery is determined from the residual charge ($Q_{Rest}$) of the battery by dividing it with the relevant load current.

11. Process according to claim 1, wherein it is carried out during the start operation of a vehicle.

12. Process according to claim 1, wherein the battery and battery system are in a vehicle and the load condition of the vehicle electrical system is altered by deliberate load changing, by switching powerful consumers in the vehicle electrical system on and off.

13. Process according to claim 1, wherein the battery and battery system are in a vehicle and the charging condition of the vehicle electrical system is deliberately altered by varying the generator voltage.

14. Process according to claim 1, wherein the battery and battery system are in a vehicle and the load condition of the vehicle electrical system is deliberately altered, both by altering the generator voltage and by switching powerful consumers on and off.

\* \* \* \* \*